United States Patent
Fujiyoshi et al.

(10) Patent No.: US 9,206,036 B2
(45) Date of Patent: Dec. 8, 2015

(54) DISPLAY DEVICE

(75) Inventors: Jun Fujiyoshi, Mobara (JP); Yasukazu Kimura, Chiba (JP)

(73) Assignee: Pixtronix, Inc., San Diego, CA (US)

(*) Notice: Subject to any disclaimer, the term of this patent is extended or adjusted under 35 U.S.C. 154(b) by 288 days.

(21) Appl. No.: 13/478,147

(22) Filed: May 23, 2012

(65) Prior Publication Data
US 2012/0300283 A1 Nov. 29, 2012

(30) Foreign Application Priority Data
May 23, 2011 (JP) .................... 2011-114362

(51) Int. Cl.
G02B 26/00 (2006.01)
G02F 1/03 (2006.01)
G02F 1/07 (2006.01)
B81C 1/00 (2006.01)
G02B 26/02 (2006.01)

(52) U.S. Cl.
CPC ............ B81C 1/00182 (2013.01); G02B 26/02 (2013.01); *B81B 2201/045* (2013.01); *B81C 2203/054* (2013.01)

(58) Field of Classification Search
USPC ......... 359/237, 242–247, 290–292, 295, 296, 359/298, 251–253, 265–267, 270, 272, 315, 359/321, 322
See application file for complete search history.

(56) References Cited

U.S. PATENT DOCUMENTS

| | | | |
|---|---|---|---|
| 6,201,633 B1 | 3/2001 | Peeters et al. | |
| 7,042,545 B2 | 5/2006 | Byun et al. | |
| 7,468,830 B2 | 12/2008 | Pan | |
| 7,742,215 B2 | 6/2010 | Hagood, IV et al. | |
| 7,919,844 B2 | 4/2011 | Ozguz et al. | |
| 7,932,985 B2 | 4/2011 | Oh | |
| 2002/0060836 A1* | 5/2002 | Uno | 359/296 |
| 2003/0090609 A1 | 5/2003 | Inoue et al. | |
| 2005/0042792 A1 | 2/2005 | Patel et al. | |

(Continued)

FOREIGN PATENT DOCUMENTS

JP 2005106856 A 4/2005
JP 2005122150 A 5/2005

(Continued)

OTHER PUBLICATIONS

T. Brosnihan et al, "Pixtronix Digital Micro Shutter Display Technology—A MEMS Display for Low Power Mobile Multimedia Displays", Proc. of SPIE, vol. 7594, Bellingham, WA, USA.

(Continued)

*Primary Examiner* — Joseph P Martinez
*Assistant Examiner* — Brandi Thomas
(74) *Attorney, Agent, or Firm* — Edward A. Gordon; Foley & Lardner LLP

(57) ABSTRACT

A cut which penetrates a resin layer is formed in the resin layer such that the cut surrounds a third upper surface. A film is formed such that the film covers the whole resin layer except for a bottom surface of the resin layer inside the cut and at least a portion of the resin layer is exposed outside the cut. The resin layer which is wholly covered with the film is left inside the cut, and the whole resin layer continuously formed with a surface exposed from the film is removed outside the cut. A bump is formed by the resin layer and the film inside the cut, and a shutter and at least a portion of a drive part are formed by the film outside the cut in a state where these parts are floated from a first substrate.

8 Claims, 12 Drawing Sheets

(56) References Cited

U.S. PATENT DOCUMENTS

| | | | |
|---|---|---|---|
| 2006/0250325 | A1 | 11/2006 | Haggod et al. |
| 2006/0274229 | A1* | 12/2006 | Ito et al. ................ 349/96 |
| 2007/0002156 | A1 | 1/2007 | Hagood, IV et al. |
| 2007/0103635 | A1 | 5/2007 | Tawaraya et al. |
| 2008/0283175 | A1* | 11/2008 | Hagood et al. ........... 156/145 |
| 2009/0066904 | A1 | 3/2009 | Zhao |
| 2010/0020382 | A1 | 1/2010 | Su et al. |
| 2010/0027100 | A1 | 2/2010 | Lee et al. |
| 2010/0053115 | A1 | 3/2010 | Kim et al. |
| 2010/0201934 | A1 | 8/2010 | Fan et al. |
| 2010/0265439 | A1 | 10/2010 | Ishitobi et al. |
| 2011/0013131 | A1* | 1/2011 | Tanaka et al. ........... 349/155 |
| 2011/0069369 | A1* | 3/2011 | Park et al. ............... 359/230 |
| 2011/0157679 | A1 | 6/2011 | Fike, III et al. |
| 2011/0235147 | A1 | 9/2011 | Lee et al. |
| 2012/0293851 | A1 | 11/2012 | Morita et al. |

FOREIGN PATENT DOCUMENTS

| | | |
|---|---|---|
| JP | 2008-197668 | 8/2008 |
| KR | 20100056734 A | 5/2010 |
| KR | 20110049557 A | 5/2011 |
| TW | 554221 B | 9/2003 |
| TW | 201133025 A | 10/2011 |
| WO | WO-03044594 A1 | 5/2003 |
| WO | WO 2006/091738 A1 | 8/2006 |
| WO | 2008091339 A2 | 7/2008 |
| WO | 2012073867 A1 | 6/2012 |

OTHER PUBLICATIONS

Co-pending U.S. Appl. No. 13/618,291, filed Sep. 14, 2012.
European Search Report—EP12168826—Search Authority—Munich—Sep. 4, 2012.
Taiwan Search Report—TW101115284—TIPO—Mar. 24, 2014.

* cited by examiner

DISPLAY DEVICE

CROSS-REFERENCE TO RELATED APPLICATION

The present application claims priority from Japanese application JP2011-114362 filed on May 23, 2011, the contents of which are hereby incorporated by reference into this application.

BACKGROUND OF THE INVENTION

1. Field of the Invention

The present invention relates to a display device and a method for manufacturing the same.

2. Description of the Related Art

An MEMS display (Micro Electro Mechanical System Display) is a display which is expected to take the place of a liquid crystal display (see JP 2008-197668 A). This display, different from a liquid crystal shutter method display which makes use of polarization, displays an image by opening or closing light transmitting windows by a mechanical shutter method. Each shutter is formed of a thin film, and a longitudinal size and a lateral size of the shutter which constitutes 1 pixel are on the order of several 100 µm, and a thickness of the shutter is on the order of several µm. By opening or closing 1 shutter, an ON/OFF operation of 1 pixel can be performed. The shutter is operated by an electrostatic attraction force.

The shutter is arranged in a space surrounded by a seal between a pair of light transmitting substrates, and the space is filled with oil. The oil prevents sticking of a spring for driving the shutter, and decreases the difference in refractive index between the oil and the light transmitting substrates.

A gap between the pair of light transmitting substrates is maintained by arranging bumps between both substrates. The bump is constituted of a pedestal which is formed on one light transmitting substrate on which the shutter and a driving mechanism of the shutter are formed and a support strut which is formed on the other light transmitting substrate which faces the one light transmitting substrate in an opposed manner in a state where the pedestal and the support strut face each other in an opposed manner. Since the pedestal can be formed simultaneously with the formation of the shutter and hence, the pedestal can be covered with a material for forming the shutter whereby resistance of the pedestal to the oil is increased. To the contrary, a resin of the support strut is exposed to the oil and hence, there exists a drawback that a component of the resin is dissolved in the oil so that a polymer is generated.

SUMMARY OF THE INVENTION

It is an object of the present invention to form bumps having high resistance to oil in a display device without increasing the number of manufacturing processes.

(1) According to one aspect of the present invention, there is provided a method for manufacturing a display device, the method including the steps of: forming a structure including a bump, a shutter and a drive part for mechanically driving the shutter on a first substrate; arranging a second substrate such that the second substrate faces the first substrate in an opposed manner; and filling a space defined between the first substrate and the second substrate with oil, wherein the step of forming the structure comprises the steps of: forming a patterned resin layer on the first substrate; forming a patterned film on the resin layer using a material for forming the shutter and the drive part which exhibits higher resistance to the oil than the resin layer does; and removing a portion of the resin layer while leaving the film, wherein the resin layer has a lowest first upper surface, a second upper surface higher than the first upper surface, a highest third upper surface, a first side surface which extends downwardly to a bottom surface from the first upper surface, and a second side surface which extends upwardly to the second upper surface from the first upper surface, and a cut is formed in the resin layer in a penetrating manner such that the cut surrounds the third upper surface, the film is formed such that the film covers the whole resin layer except for the bottom surface of the resin layer inside the cut and at least a portion of the resin layer is exposed outside the cut, in the step of removing the portion of the resin layer, the resin layer which is wholly covered with the film is left inside the cut, and the whole resin layer which is continuously formed with a surface of the resin layer exposed from the film is removed outside the cut, and in the step of forming the structure, the bump is formed by the resin layer and the film inside the cut, and the shutter and at least a portion of the drive part are formed by the film outside the cut. According to the present invention, with respect to the resin layer which constitutes the inside of the bump, the whole resin layer except for the bottom surface of the resin layer is covered with the film made of the material exhibiting higher resistance to the oil than the resin layer does and hence, a component of the resin layer is not dissolved in oil. Further, the film can be simultaneously formed with the formation of the shutter and the drive part and hence, the increase of manufacturing processes is also prevented.

(2) In the method for manufacturing a display device having the constitution (1), the step of forming the patterned resin layer on the first substrate may include the steps of: forming a first photoresist layer on the first substrate; patterning the first photoresist layer by photolithography such that the first photoresist layer has the first upper surface; forming a second photoresist layer on the patterned first photoresist layer; patterning the second photoresist layer by photolithography such that the second photoresist layer has the second upper surface; forming a third photoresist layer on the patterned second photoresist layer; and patterning the third photoresist layer by photolithography such that the third photoresist layer has the third upper surface.

(3) In the method for manufacturing a display device having the constitution (1), the step of forming the patterned resin layer on the first substrate may include the steps of: forming a first photoresist layer having a thickness exceeding a height of the first upper surface on the first substrate; patterning the first photoresist layer by photolithography including multi-tone exposure such that the first photoresist layer has the first upper surface and an intermediate upper surface higher than the first upper surface; forming a second photoresist layer on the patterned first photoresist layer; and patterning the second photoresist layer by photolithography such that a portion having the second upper surface is arranged above the first upper surface, and a portion having the third upper surface is arranged above the intermediate upper surface.

(4) In the method for manufacturing a display device having the constitution (1), the step of forming the patterned resin layer on the first substrate may include the steps of: forming a first photoresist layer having at least a thickness corresponding to a height of the third upper surface on the first substrate; patterning the first photoresist layer by photolithography including multi-tone exposure such that the first photoresist layer has the first upper surface and the third upper surface; forming a second photoresist layer on the patterned first photoresist layer; and patterning the second photoresist layer by photolithography such that the second photoresist layer has the second upper surface.

(5) In the method for manufacturing a display device having the constitution (1), the step of forming the patterned resin layer on the first substrate may include the steps of: forming a first photoresist layer having at least a thickness corresponding to a height of the first upper surface on the first substrate; patterning the first photoresist layer by photolithography such that the first photoresist layer has the first upper surface; forming a second photoresist layer having at least a thickness which reaches a height of the third upper surface on the patterned first photoresist layer; and patterning the second photoresist layer by photolithography including multi-tone exposure such that the second photoresist layer has the second upper surface and the third upper surface.

(6) In the method for manufacturing a display device having the constitution (1), the step of forming the patterned resin layer on the first substrate may includes the steps of: forming a first photoresist layer having at least a thickness corresponding to a height of the first upper surface on the first substrate; patterning the first photoresist layer by photolithography such that the first photoresist layer has the first upper surface by removing a region where the third upper surface is formed; forming a second photoresist layer having at least a thickness which reaches a height of the third upper surface on the first substrate and on the patterned first photoresist layer; and patterning the second photoresist layer by photolithography including multi-tone exposure such that the second photoresist layer has the second upper surface and the third upper surface.

(7) In the method for manufacturing a display device having any one of the constitutions (1) to (6), in the photolithography where the third upper surface is formed, the exposure using a multi-tone mask may be performed such that solubility in a developer in a region where a peripheral portion of the third upper surface is formed is higher than solubility in the developer in a region where a center portion of the third upper surface is formed and is lower than solubility in the developer in a region where the cut is formed, and the peripheral portion of the third upper surface may be formed obliquely downwardly.

(8) According to another aspect of the present invention, there is provided a display device including: a first substrate; a shutter which is formed on the first substrate and a drive part for mechanically driving the shutter which is connected to the shutter; a second substrate which is arranged such that the second substrate faces the first substrate in an opposed manner with a distance therebetween; a bump which is arranged between the first substrate and the second substrate; and oil which is filled into a space defined between the first substrate and the second substrate, wherein the bump includes a resin layer which is formed on the first substrate and a film which covers the whole resin layer except for a bottom surface of the resin layer, and the shutter and the drive part are made of the same material as the film. The film may exhibit higher resistance to the oil than the resin layer does. According to the present invention, with respect to the resin layer which constitutes the inside of the bump, the whole resin layer is covered with the film made of a material exhibiting higher resistance to the oil than the resin layer does except for the bottom surface of the resin layer and hence, a component of the resin layer is not dissolved in the oil.

DETAILED DESCRIPTION OF THE INVENTION

Embodiments of the present invention are explained hereinafter in conjunction with drawings.

Figure 1:
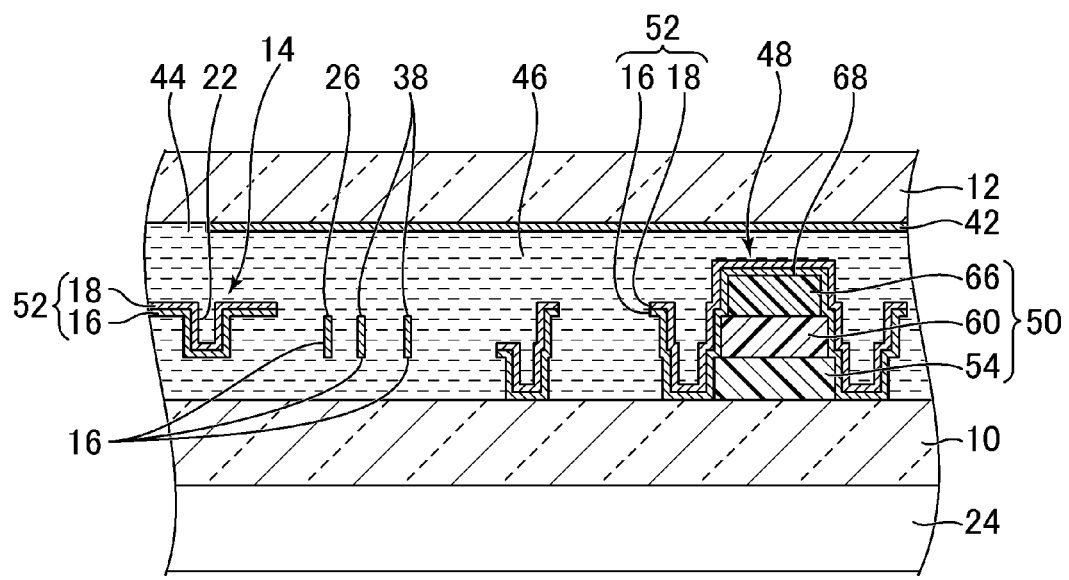
FIG. 1 is a cross-sectional view of a display device according to an embodiment of the present invention.

FIG. 1 is a cross-sectional view of a display device according to the embodiment of the present invention. The display device includes a first substrate 10 (for example, a glass substrate) having light transmitting property and a second substrate 12 (for example, a glass substrate) having light transmitting property. The first substrate 10 and the second substrate 12 are arranged such that these substrates face each other with a distance therebetween. The first substrate 10 is a printed circuit board or a TFT (Thin Film Transistor) substrate on which thin film transistors, lines and the like not shown in the drawing are formed. A plurality of (a large number of) shutters 14 are mounted on the first substrate 10. The shutters 14 are arranged above the thin film transistors, the lines and the like not shown in the drawing.

Figure 2:
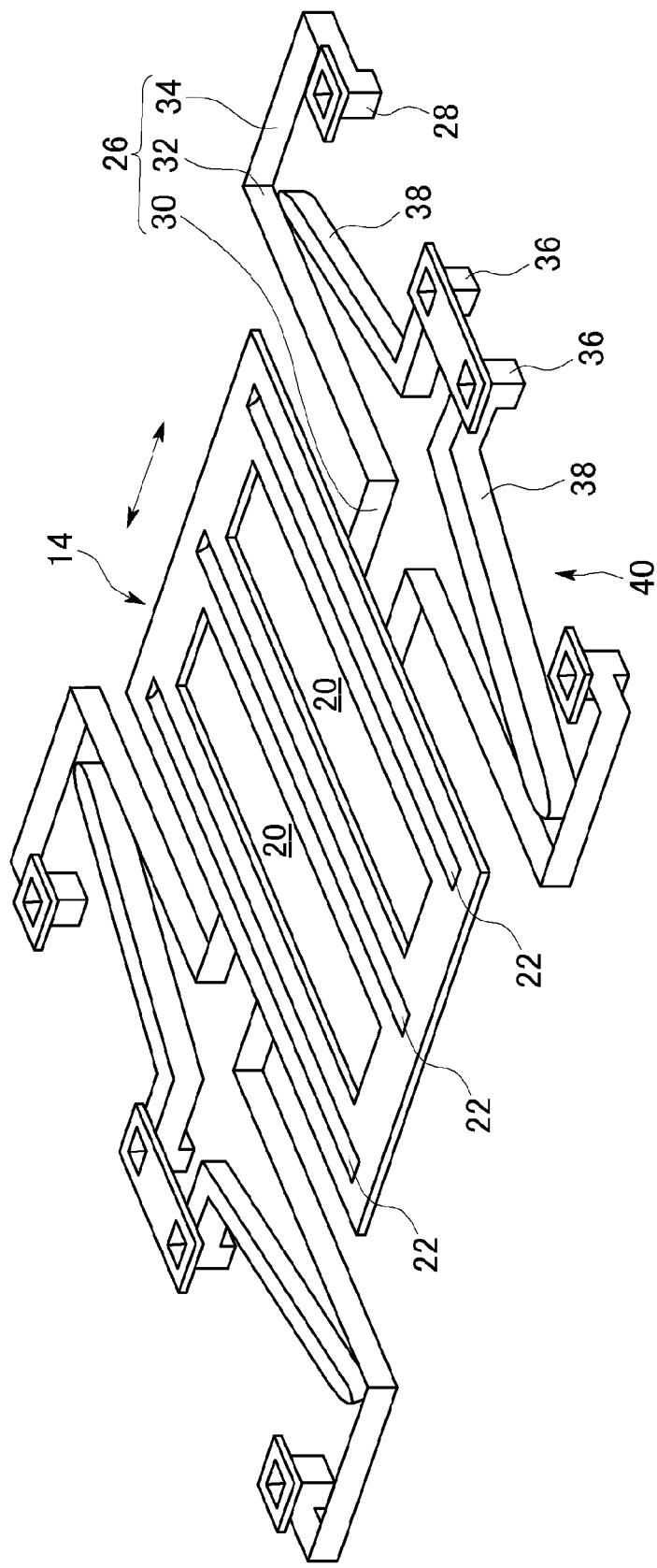
FIG. 2 is a perspective view of a shutter and a drive part for driving the shutter.

FIG. 2 is a perspective view of the shutter 14 and a drive part for driving the shutter 14. The shutter 14 is made of an inorganic material. The shutter 14 shown in FIG. 1 is formed of a film 52 which includes a first film 16 made of semiconductor such as amorphous silicon and a second film 18 made of metal such as aluminum. The shutter 14 is a plate having drive openings 20. Although recessed portions 22 are formed on the shutter 14 for increasing the strength of the shutter 14, the recessed portions 22 do not penetrate the shutter 14. Light passes through the drive openings 20 and light is blocked by portions of the shutter 14 other than the drive openings 20. The drive opening 20 has a shape elongated in one direction. Light is supplied from a back light 24 which is overlapped to the first substrate 10.

The shutter 14 is configured to be floated from the first substrate 10 by being supported by first springs 26. The shutter 14 is supported by the plurality of (4 in the drawing) first springs 26. The first springs 26 are fixed to the first substrate 10 by first anchor portions 28.

The first spring 26 is made of a resiliently deformable material. The first spring 26 has a plate shape with a small thickness, and is arranged such that the thickness direction is directed in the lateral direction (the direction parallel to a plate surface of the first substrate 10) and the widthwise direction is directed in the vertical direction (the direction perpendicular to the plate surface of the first substrate 10). Due to such a constitution, the first spring 26 is deformable in the lateral direction which is the thickness direction of the first spring 26.

The first spring 26 includes a first portion 30 which extends in the direction away from the shutter 14 (in the direction intersecting (for example, orthogonal to) the lengthwise direction of the drive opening 20), a second portion 32 which extends in the direction along the lengthwise direction of the drive opening 20 and in the outward direction from the center in the lengthwise direction of the drive opening 20, and a third portion 34 which further extends in the direction away from the shutter 14 (in the direction intersecting (for example, orthogonal to) the lengthwise direction of the drive circuit 20). As indicated by an arrow in FIG. 2, the shutter 14 is supported by the first springs 26 in a state where the shutter 14 is movable in the direction intersecting (for example, orthogonal to) the lengthwise direction of the drive openings 20.

The first substrate 10 is provided with second springs 38 which are supported on second anchor portions 36. The second springs 38 are also made of a resiliently deformable material. The second spring 38 has a plate shape with a small thickness, and is arranged such that the thickness direction is directed in the lateral direction (the direction parallel to the plate surface of the first substrate 10) and the widthwise direction is directed in the vertical direction (in the direction perpendicular to the plate surface of the first substrate 10). Due to such a constitution, the second spring 38 is deformable in the lateral direction which is the thicknesswise direction of the second spring 38. Further, the second spring 38 has a loop shape such that a strip portion which extends from the second anchor portion 36 is bent and folded and returns to the same second anchor portion 36.

The second spring 38 faces the second portion 32 of the first spring 26 on a side where the second spring 38 is more away from the shutter 14 than the second portion 32 of the first spring 26. When a voltage is applied to the second anchor portion 36, due to an electrostatic attraction force generated due to the potential difference between the second anchor portion 36 and the second portion 32 of the first spring 26, the second portion 32 is attracted to the second anchor portion 36. When the second portion 32 is attracted, the shutter 14 is also attracted by way of the first portion 30 which is integrally formed with the second portion 32. That is, the first spring 26 and the second spring 38 are provided for constituting a drive part 40 for mechanically driving the shutter 14.

The drive part 40 is formed using the same material as at least a portion of the shutter 14. For example, the first spring 26 and the second spring 38 are constituted of a portion of the film 52 (for example, the first film 16 made of semiconductor such as amorphous silicon) which constitutes the shutter 14. Other portions of the drive part 40 may be constituted of a film which includes the first film 16 made of semiconductor such as amorphous silicon and the second film 18 made of metal such as aluminum.

A light blocking film 42 is formed on the second substrate 12. A fixed opening 44 is formed in the light blocking film 42. The above-mentioned drive opening 20 formed in the shutter 14 and the fixed opening 44 formed in the light blocking film 42 are arranged at a position where the drive opening 20 and the fixed opening 44 face each other in an opposed manner. When both openings 20, 44 communicate with each other, light passes through the both openings 20, 44, while when the fixed opening 44 formed in the light blocking film 42 is shielded by the movement of the shutter 14, light is blocked. In other words, the shutter 14 is mechanically driven so as to control passing and blocking of light with respect to the fixed opening 44 formed in the light blocking film 42. One pixel is constituted of one drive opening 20 and one fixed opening 44 which correspond to each other, and an image is displayed by a large number of pixels. Accordingly, the plurality of (the large number of) shutters 14 are provided. The shutters 14 and the drive parts 40 are arranged in a display region where an image is displayed in accordance with the presence or the non-presence and the magnitude of light which passes through the drive openings 20 and the fixed openings 44.

The first substrate 10 and the second substrate 12 are fixed to each other with a distance therebetween by a sealing member not shown in the drawing. The sealing member is adhered to oppositely facing surfaces of the first substrate 20 and the second substrate 12. Oil 46 (for example, silicone oil) is filled into a space defined between the first substrate 10 and the second substrate 12 (in a space sealed by the sealing member not shown in the drawing). The shutters 14 and the drive parts 40 are arranged in the oil 46. Vibrations caused by the movement of the shutters 14 and the drive parts 40 can be suppressed by the oil 46, and sticking of the first springs 26 and the second springs 38 can be also prevented. When the first substrate 10 and the second substrate 12 are made of glass, by filling the space defined between the first substrate 10 and the second substrate 12 with the oil 46 having a refractive index close to a refractive index of glass, the reflection of light on interfaces between the oil 46 and the first substrate 10 and the second substrate 12 can be reduced.

The display device includes bumps 48 which hold the distance between the first substrate 10 and the second substrate 12. The bump 48 includes a resin layer 50 which is formed on the first substrate 10. The whole resin layer 50 is covered with the film 52 except for a bottom surface of the resin layer 50. The film 52 is made of a material which is used for forming the shutter 14 and the drive part 40. For example, the film 52 includes the first film 16 made of semiconductor such as amorphous silicon and the second film 18 made of metal such as aluminum. These materials exhibit higher resistance to the oil 46 than the resin layer 50 does. The bumps 48 are also arranged in the oil 46. The bump 48 shown in FIG. 1 is formed with a height which allows the formation of a gap between the bump 48 and the second substrate 12 so that the oil 46 enters between the bump 48 and the light blocking film 42. Accordingly, an upper surface of the bump 48 is also in contact with the oil 46. When a force which makes the first substrate 10 and the second substrate 12 approach each other is applied to the substrates, the bump 48 is brought into contact with the light blocking film 42 so that further approach of both substrates can be prevented. However, the bump 48 may be formed such that the upper surface of the bump 48 is in contact with the second substrate 12 or is in contact with the light blocking film 42 formed on the second substrate 12.

According to this embodiment, the whole resin layer 50 which constitutes the inside of the bump 48 is covered with the film 52 made of a material having higher resistance to the oil 46 than the resin layer 50 does except for a bottom surface (a surface which is in close contact with the first substrate 10) of the resin layer 50 and hence, dissolution of a component of the resin layer 50 in the oil 46 can be prevented.

Next, a method for manufacturing a display device according to the embodiments of the present invention is explained.

First Embodiment

FIG. 3A to FIG. 3L are views for explaining a method for manufacturing a display device according to the first embodiment of the present invention.

Figure 3A:
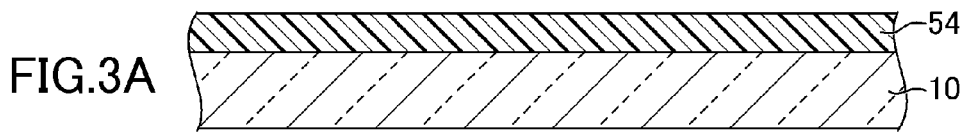
FIG. 3A is a view for explaining a method for manufacturing a display device according to a first embodiment of the present invention.

As shown in FIG. 3A, a first photoresist layer 54 is formed on the first substrate 10. The first photoresist layer 54 is made of a resin having photo sensitivity. The first photoresist layer 54 has at least a thickness corresponding to a floating height of the above-mentioned shutter 14. That is, the thickness of the first photoresist layer 54 is equal to or higher than the floating height of the shutter 14. Further, the first photoresist layer 54 has at least a thickness corresponding to a floating height of portions of the drive part 40 (for example, the first spring 26 and the second spring 38) in a state the portions float from the first substrate 10. That is, the thickness of the first photoresist layer 54 is equal to or higher than the floating height of the first spring 26 and the second spring 38. As shown in FIG. 1, a lower end (a surface opposite to the recessed portion 22) of the shutter 14 and lower ends of the first spring 26 and the second spring 38 are arranged at the same height.

Figure 3B:
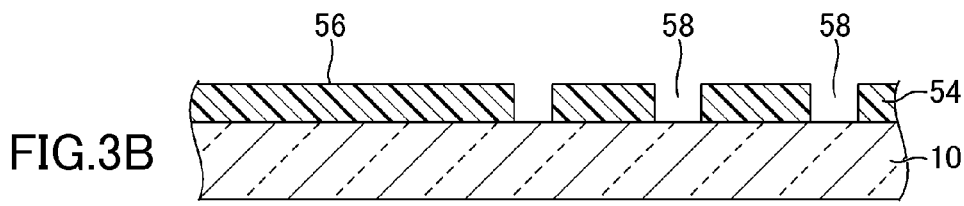
FIG. 3B is a view for explaining the method for manufacturing a display device according to the first embodiment of the present invention.

As shown in FIG. 3B, the first photoresist layer 54 is patterned by photolithography. The photolithography includes exposure and development. In the exposure, light is irradiated to the first photoresist layer 54 partially by way of a mask not shown in the drawing. Accordingly, the first photoresist layer 54 includes portions which are dissolved by a developer and portions which are hardly dissolved by the developer. By performing the development, the first photoresist layer 54 is patterned. The patterned first photoresist layer 54 has a first upper surface 56. The first upper surface 56 is a surface for forming members which are arranged in a floating manner from the first substrate 10 (for example, the shutter 14, the first spring 26 and the second spring 38). Accordingly, a height position of the first upper surface 56 (a height position from an upper surface of the first substrate 10, the same definition being applicable hereinafter) becomes a height position of the lower end (the lowermost surface) of the shutter 14 and the lower ends of the first spring 26 and the second spring 38. Since the first photoresist layer 54 is shrunken by hardening treatment, the height position of the first upper surface 56 becomes slightly lower than a height position before hardening treatment. A portion of the first photoresist layer 54 becomes a portion of the resin layer 50 of the bump 48. Accordingly, a first cut 58 which surrounds the resin layer 50 of the bump 48 is formed in the first photoresist layer 54.

Figure 3C:
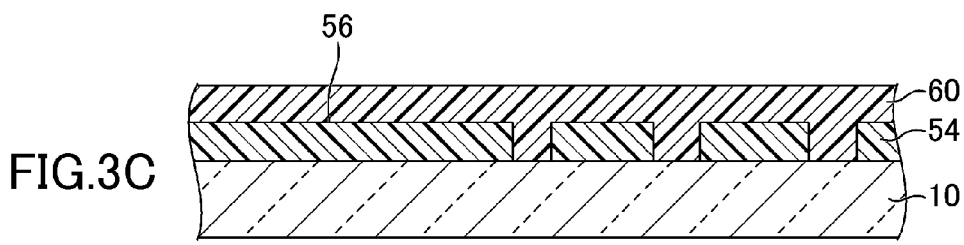
FIG. 3C is a view for explaining the method for manufacturing a display device according to the first embodiment of the present invention.

As shown in FIG. 3C, a second photoresist layer 60 is formed on the patterned first photoresist layer 54. The second photoresist layer 60 is also a resin precursor having photosensitivity. The second photoresist layer 60 has at least a thickness corresponding to widths of the first spring 26 and the second spring 38 in the height direction. That is, the thickness of the second photoresist layer 60 is equal to or more than the widths of the first spring 26 and the second spring 38 in the height direction. Further, in forming the recessed portions 22 in the shutter 14, the second photoresist layer 60 has at least a thickness corresponding to a depth of the recessed portion 22 (to be more accurate, the difference in height from a projecting lower surface of the recessed portion 22 which projects downwardly and a lower surface of a portion of the shutter 14 around the recessed portion 22). That is, the thickness of the second photoresist layer 60 is equal to or more than the depth of the recessed portion 22.

Figure 3D:
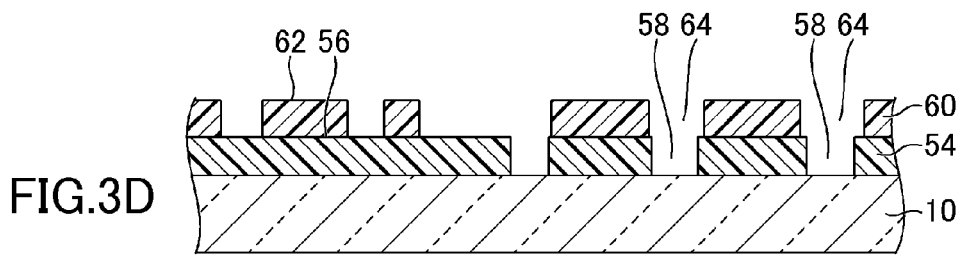
FIG. 3D is a view for explaining the method for manufacturing a display device according to the first embodiment of the present invention.

As shown in FIG. 3D, the second photoresist layer 60 is pattered by photolithography. The detail of the photolithography is exactly as described above. The patterned second photoresist layer 60 has a second upper surface 62. A height from the first upper surface 56 to the second upper surface 62 corresponds to the widths of the first spring 26 and the second spring 38 in the height direction. The height from the first upper surface 56 to the second upper surface 62 corresponds to the depth of the recessed portion 22 formed in the shutter 14. Further, since the second photoresist layer 60 is also shrunken by the hardening treatment, a height position of the second upper surface 62 becomes slightly lower than a height position before the hardening treatment. Further, a portion of the second photoresist layer 60 is formed into a portion of the resin layer 50 of the bump 48. Accordingly, a second cut 64 which surrounds the resin layer 50 of the bump 48 is formed in the second photoresist layer 60.

Figure 3E:
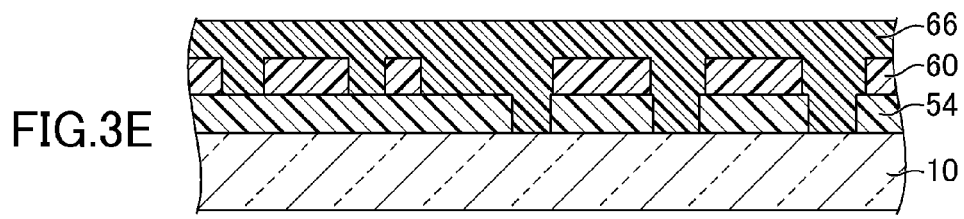
FIG. 3E is a view for explaining the method for manufacturing a display device according to the first embodiment of the present invention.

As shown in FIG. 3E, a third photoresist layer 66 is formed on the patterned second photoresist layer 60. The third photoresist layer 66 is also formed of a resin precursor having photosensitivity. The third photoresist layer 66 has at least a thickness which allows an upper surface of the third photoresist layer 66 to reach a height position of an upper surface of the resin layer 50 of the bump 48 (a height position from the upper surface of the first substrate 10).

Figure 3F:
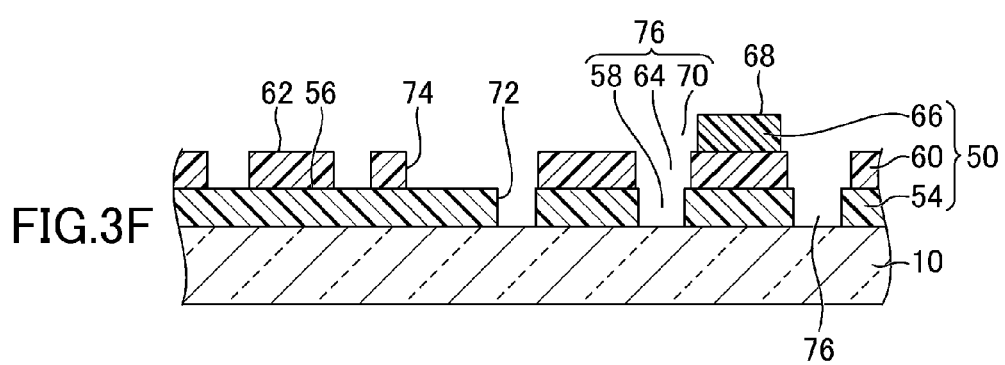
FIG. 3F is a view for explaining the method for manufacturing a display device according to the first embodiment of the present invention.

As shown in FIG. 3F, the third photoresist layer 66 is patterned by photolithography. The detail of the photolithography is as exactly described above. The patterned third photoresist layer 66 has a third upper surface 68. A height from the upper surface of the first substrate 10 to the third upper surface 68 a height of the resin layer 50 of the bump 48. Since the third photoresist layer 66 is also shrunken by the hardening treatment, a height position of the third upper surface 68 becomes slightly lower than a height position before the hardening treatment. Further, a portion of the third photoresist layer 66 becomes a portion of the resin layer 50 of the bump 48. Accordingly, a third cut 70 which surrounds the resin layer 50 of the bump 48 is formed in the third photoresist layer 66.

In this manner, the resin layer 50 is formed of the first photoresist layer 54, the second photoresist layer 60 and the third photoresist layer 66. That is, the patterned resin layer 50 is formed on the first substrate 10. The resin layer 50 has the lowest first upper surface 56. The resin layer 50 has the second upper surface 62 higher than the first upper surface 56. The resin layer 50 has the highest third upper surface 68. The resin layer 50 has a first side surface 72 which extends downwardly from the first upper surface 56 to the bottom surface. The resin layer 50 has a second side surface 74 which extends upwardly from the first upper surface 56 to the second upper surface 62. A cut 76 which penetrates the resin layer 50 is formed in the resin layer 50 such that the cut 76 surrounds the third upper surface 68. The cut 76 is formed by making the first cut 58, the second cut 64 and the third cut 70 formed in the first photoresist layer 54, the second photoresist layer 60 and the third photoresist layer 66 respectively communicate with each other.

Figure 3G:
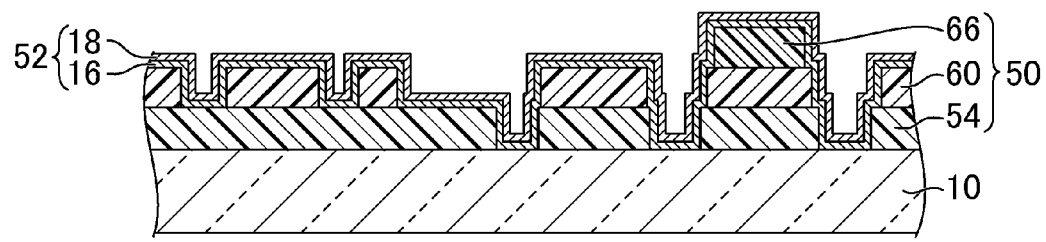
FIG. 3G is a view for explaining the method for manufacturing a display device according to the first embodiment of the present invention.

As shown in FIG. 3G, the film 52 is formed on the resin layer 50 and the first substrate 10. The film 52 is made of a material for forming the shutters 14 and the drive parts 40, and the material has higher resistance to the oil 46 than the resin layer 50 does (inorganic material or the like). For example, in forming the film 52, the first film 16 made of semiconductor such as amorphous silicon is formed, and the second film 18 made of metal such as aluminum is formed on the first film 16.

Figure 3H:
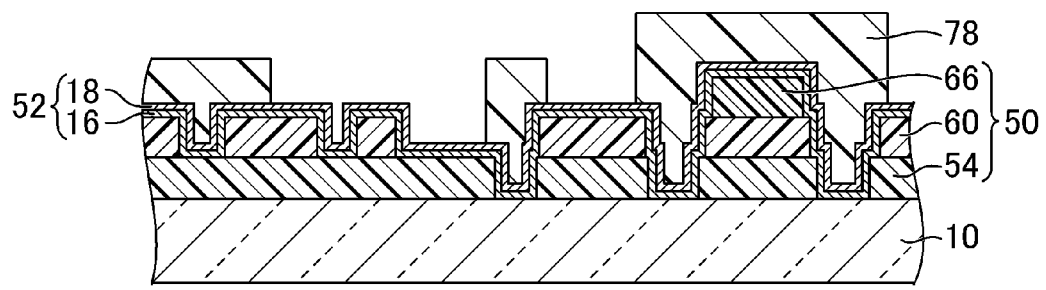
FIG. 3H is a view for explaining the method for manufacturing a display device according to the first embodiment of the present invention.

As shown in FIG. 3H, an etching resist 78 is formed on the film 52. Lithography is also applicable to patterning of the etching resist 78. The patterned etching resist 78 covers a region where the shutter 14, the drive part 40 and the bump 48 are formed.

Figure 3I:
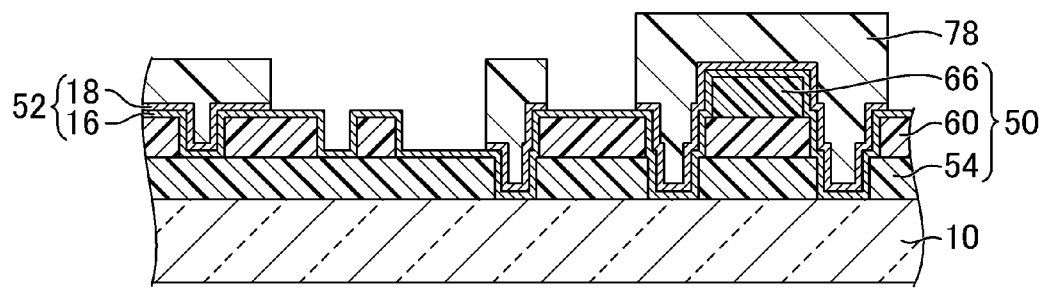
FIG. 3I is a view for explaining the method for manufacturing a display device according to the first embodiment of the present invention.

As shown in FIG. 3I, the second film 18 made of metal is etched by applying wet etching to the second film 18. Due to isotropic property of the wet etching, the second film 18 exposed from the etching resist 78 is removed.

Figure 3J:
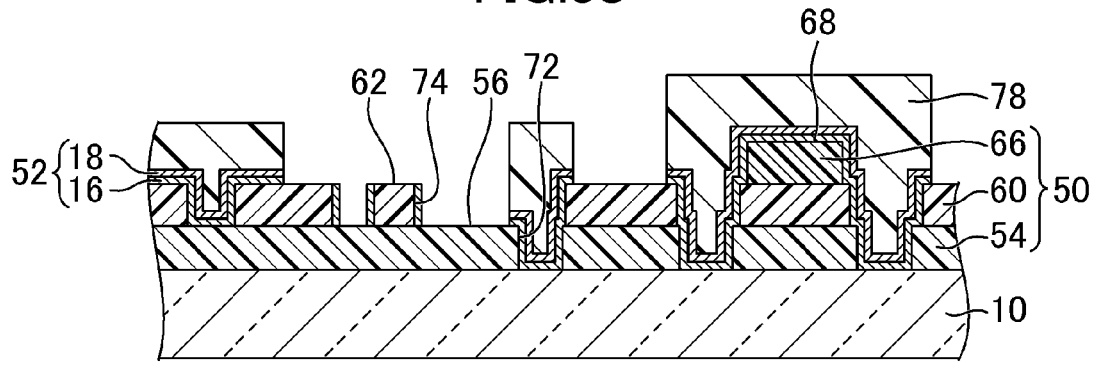
FIG. 3J is a view for explaining the method for manufacturing a display device according to the first embodiment of the present invention.

As shown in FIG. 3J, the first film 16 made of semiconductor is etched by applying dry etching to the first film 16. Due to anisotropic property of the dry etching, although the first film 16 formed on the upper surface (the first upper surface 56 and the second upper surface 62) of the resin layer 50 is removed, the first film 16 on a side surface (the second side surface 74) of the resin layer 50 is not removed and remains.

Figure 3K:
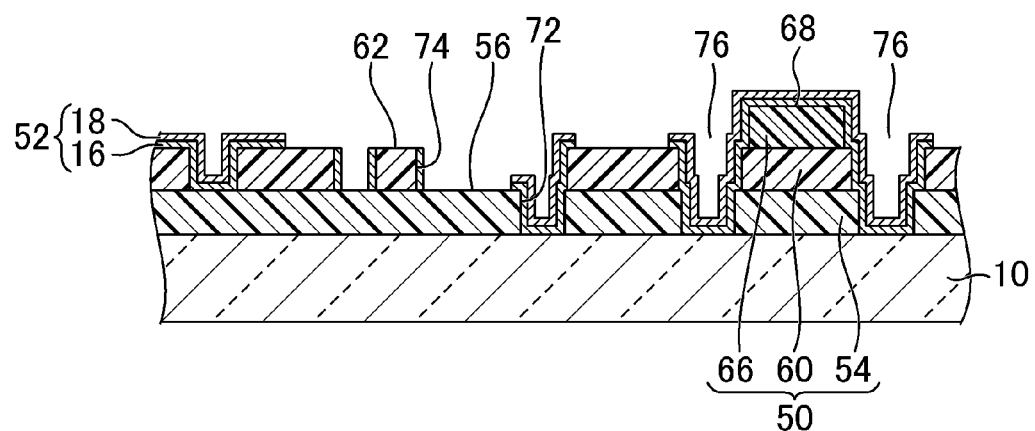
FIG. 3K is a view for explaining the method for manufacturing a display device according to the first embodiment of the present invention.

The etching resist 78 is removed as shown in FIG. 3K. In a region where the shutter 14 is formed, the film 52 (the first film 16 and the second film 18) remains on the first upper surface 56, the first side surface 72 and the second upper surface 62 of the resin layer 50. In regions where the first spring 26 and the second spring 38 are formed respectively, the film 52 (the first film 16) remains on the second side surface 74 of the resin layer 50. Inside the cut 76 formed in the resin layer 50, the film 52 (the first film 16 and the second film 18) remains such that the film 52 covers the whole resin layer 50 except for the bottom surface of the resin layer 50. Outside the cut 76 formed in the resin layer 50, the film 52 remains such that at least a portion of the resin layer 50 is exposed.

Figure 3L:
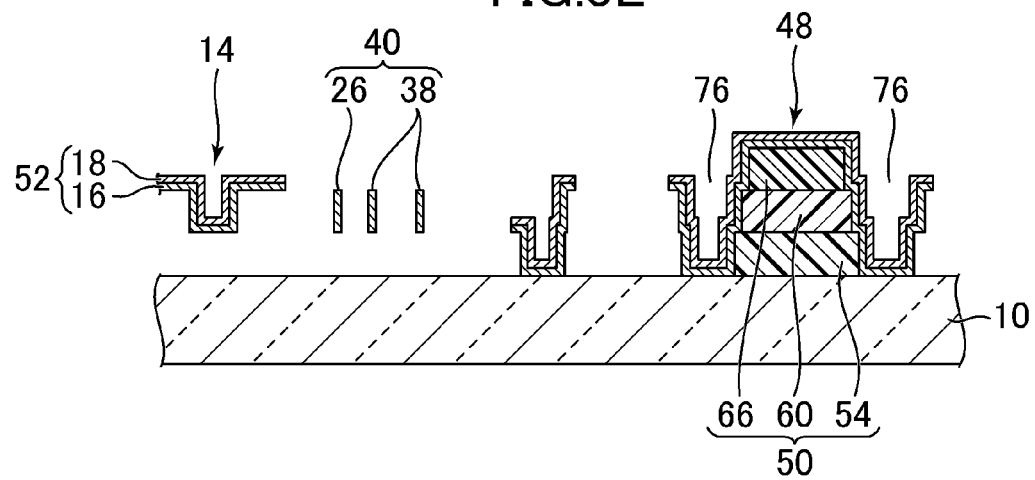
FIG. 3L is a view for explaining the method for manufacturing a display device according to the first embodiment of the present invention.

As shown in FIG. 3L, the resin layer 50 exposed from the film 52 is removed. For example, asking is applicable for the removal of the resin layer 50. The removal of the resin layer 50 may be performed simultaneously with the removal of the above-mentioned etching resist 78. Due to such a step, a portion of the resin layer 50 can be removed while leaving the film 52. Inside the cut 76 formed in the resin layer 50, the resin layer 50 which is wholly covered with the film 52 remains. Outside the cut 76 formed in the resin layer 50, the whole resin layer 50 contiguously formed with a surface of the resin layer 50 exposed from the film 52 is removed.

Inside the cut 76, the bump 48 constituted of the resin layer 50 and the film 52 is formed. Outside the cut 76, the shutter 14 and at least a portion of the drive part 40 are formed using the film 52 in a state where the shutter 14 and at least the portion of the drive part 40 are floated from the first substrate 10. Due to such a step, on the first substrate 10, a structure which includes the bump 48, the shutter 14 and the drive part 40 which mechanically drives the shutter 14 is formed.

Thereafter, as shown in FIG. 1, the second substrate 12 is arranged such that the second substrate 12 faces the first substrate 10 in an opposed manner with the bump 48 therebetween. The oil 46 is filled into a space defined between the first substrate 10 and the second substrate 12.

According to this embodiment, the resin layer 50 which constitutes the inside of the bump 48 is configured such that the whole resin layer 50 is covered with the film 52 made of a material having higher resistance to the oil 46 than the resin layer 50 does except for the bottom surface of the resin layer 50 and hence, the dissolution of a component of the resin layer 50 in the oil 46 can be prevented. Further, the film 52 is formed simultaneously with the formation of the shutter 14 and the drive part 40 and hence, there is no possibility that the number of manufacturing processes is increased.

Second Embodiment

FIG. 4A to FIG. 4F are views for explaining a method for manufacturing a display device according to the second embodiment of the present invention.

Figure 4A:
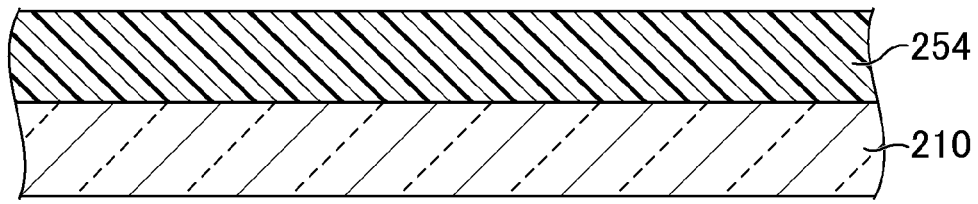
FIG. 4A is a view for explaining a method for manufacturing a display device according to a second embodiment of the present invention.

As shown in FIG. 4A, a first photoresist layer 254 having a thickness which exceeds a height of a first upper surface 256 described later is formed on a first substrate 210. The first photoresist layer 254 is preferably formed with a thickness such that an upper surface of the first photoresist layer 254 is positioned at the same height as a second upper surface 262 described later when the first photoresist layer 254 is shrunken by hardening.

Figure 4B:
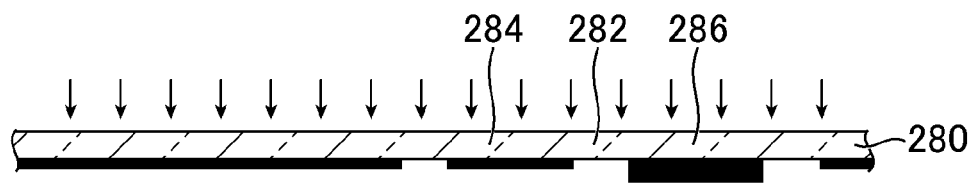
FIG. 4B is a view for explaining the method for manufacturing a display device according to the second embodiment of the present invention.
Figure 4B:
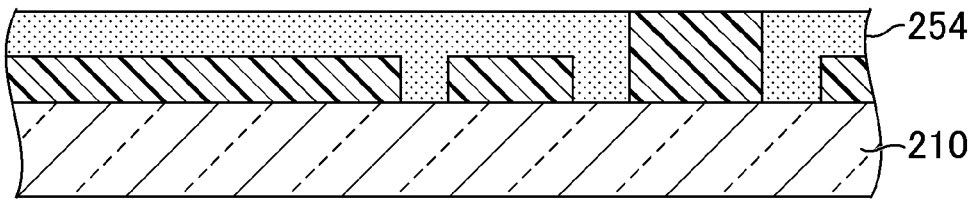

As shown in FIG. 4B, the first photoresist layer 254 is patterned by photolithography. The photolithography includes the multi-tone exposure (for example, half tone exposure). To be more specific, the exposure is performed using a mask 280 which has a light transmitting region 282, a light semi-transmitting region 284 and a light blocking region 286. It is sufficient that the light semi-transmitting region 284 is a region where optical transmissivity is lower than optical transmissivity of the light transmitting region 282 so that the optical transmissivity of the light semi-transmitting region 284 is not limited to 50%. When the first photoresist layer 254 is made of a positive photoresist, a region to which light which passes through the light transmitting region 282 is irradiated is wholly likely to be dissolved in the thickness direction by a developer, and a region to which light which passes through the light semi-transmitting region 284 is irradiated is likely to be partially dissolved in the thickness direction by the developer. A region to which light is not irradiated is hardly dissolved by the developer. Although a negative photoresist may be used for forming the first photoresist layer 254, the detail of the negative photoresist is well-known in the same manner as the positive photoresist and hence, the explanation of the negative photoresist is omitted.

Figure 4C:
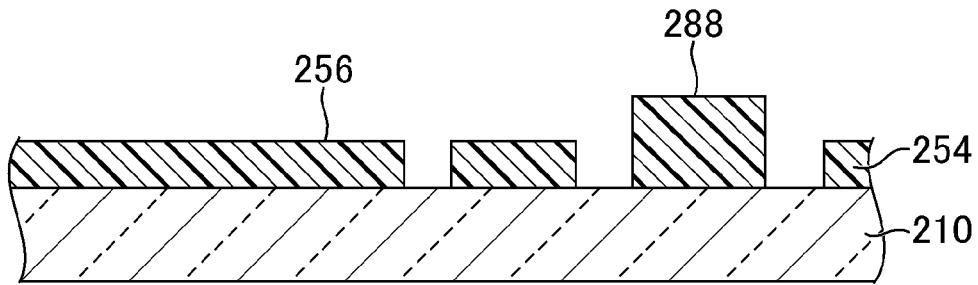
FIG. 4C is a view for explaining the method for manufacturing a display device according to the second embodiment of the present invention.

As shown in FIG. 4C, by performing the development, the first photoresist layer 254 is patterned such that the first photoresist layer 254 has the first upper layer 256 and an intermediate upper surface 288 which is higher than the first upper surface 256. The intermediate upper surface 288 may have the same height as the second upper surface 262 described later. According to this embodiment, by applying the multi-tone exposure to the first photoresist layer 254, the upper surface having the height in two stages (the first upper surface 256 and the intermediate upper surface 288) can be formed by one photolithography and hence, the process can be simplified.

Figure 4D:
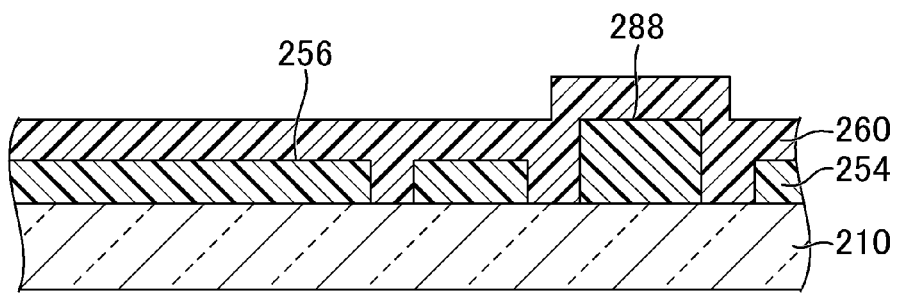
FIG. 4D is a view for explaining the method for manufacturing a display device according to the second embodiment of the present invention.

As shown in FIG. 4D, a second photoresist layer 260 is formed on the patterned first photoresist layer 254. The second photoresist layer 260 is formed with a thickness which reaches a height position of a third upper surface 268 above the intermediate upper surface 288.

Figure 4E:
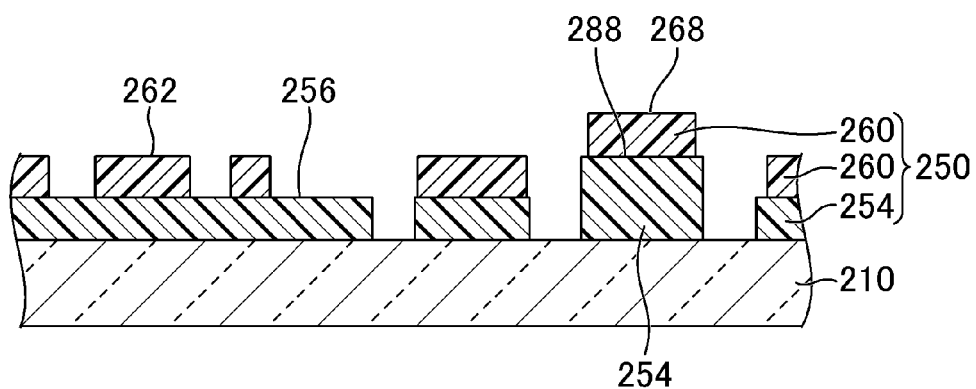
FIG. 4E is a view for explaining the method for manufacturing a display device according to the second embodiment of the present invention.
Figure 4F:
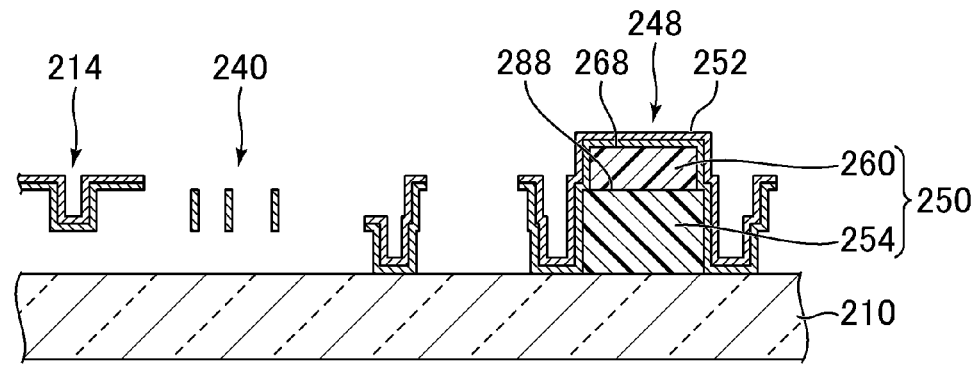
FIG. 4F is a view for explaining the method for manufacturing a display device according to the second embodiment of the present invention.

As shown in FIG. 4E, the second photoresist layer 260 is patterned by photolithography. To be more specific, on the first upper surface 256 of the first photoresist layer 254, a portion having the second upper surface 262 is formed from a portion of the second photoresist layer 260. Further, on the intermediate upper surface 288 of the first photoresist layer 254, a portion having the third upper surface 268 is formed from a portion of the second photoresist layer 260. Due to such a process, a resin layer 250 having the first upper surface 256, the second upper surface 262 and the third upper surface 268 is formed. A film 252 is formed on the resin layer 250, and the film 252 is patterned thus, as shown in FIG. 4F, forming a structure which includes a bump 248, a shutter 214 and a drive part 240 which mechanically drives the shutter 214 on the first substrate 210.

With respect to the detail of other parts of this embodiment, the contents explained in conjunction with the first embodiment are applicable to these other parts.

Third Embodiment

FIG. 5A to FIG. 5E are views for explaining a method for manufacturing a display device according to the third embodiment of the present invention.

Figure 5A:
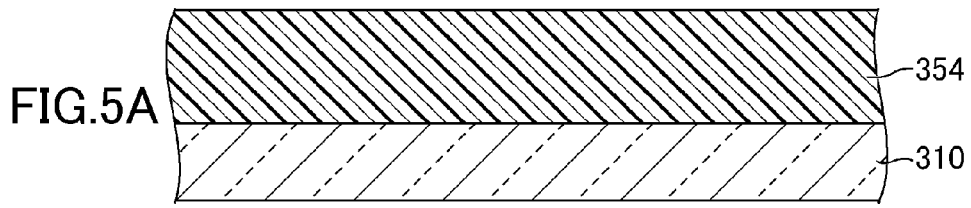
FIG. 5A is a view for explaining a method for manufacturing a display device according to a third embodiment of the present invention.

As shown in FIG. 5A, a first photoresist layer 354 having at least a thickness which allows an upper surface thereof to reach a height position of a third upper surface 368 described later is formed on a first substrate 310.

Figure 5B:
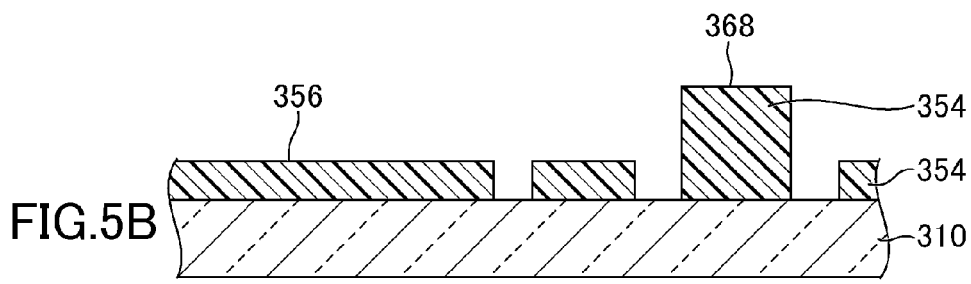
FIG. 5B is a view for explaining the method for manufacturing a display device according to the third embodiment of the present invention.

As shown in FIG. 5B, the first photoresist layer 354 is patterned by photolithography including the multi-tone exposure such that the first photoresist layer 354 has a first upper layer 356 and the third upper surface 368. The detail of this step is exactly the same as the corresponding step explained in conjunction with the second embodiment.

Figure 5C:
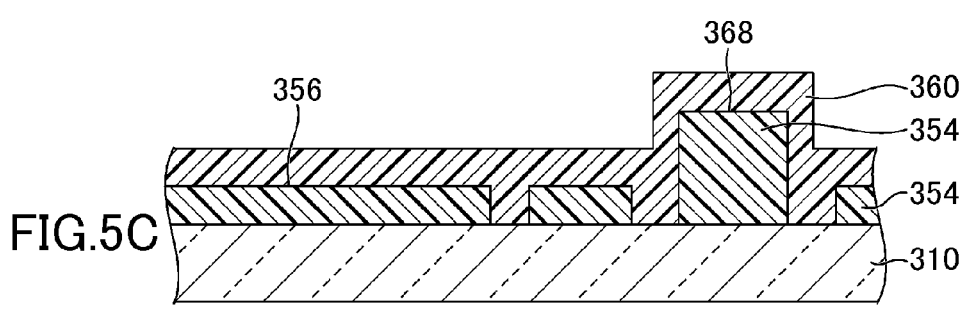
FIG. 5C is a view for explaining the method for manufacturing a display device according to the third embodiment of the present invention.

As shown in FIG. 5C, a second photoresist layer 360 is formed on the patterned first photoresist layer 354. Above the first upper surface 356, the second photoresist layer 360 is formed with a thickness such that an upper surface of the second photoresist layer 360 becomes equal to a height position of a second upper surface 362 described later or above such a height position.

Figure 5D:
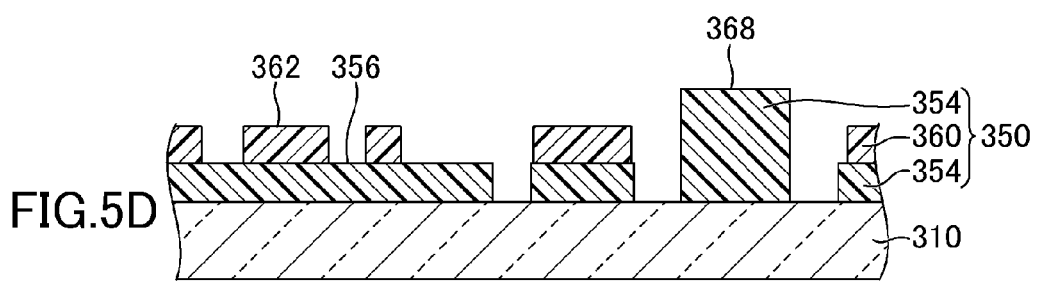
FIG. 5D is a view for explaining the method for manufacturing a display device according to the third embodiment of the present invention.
Figure 5E:
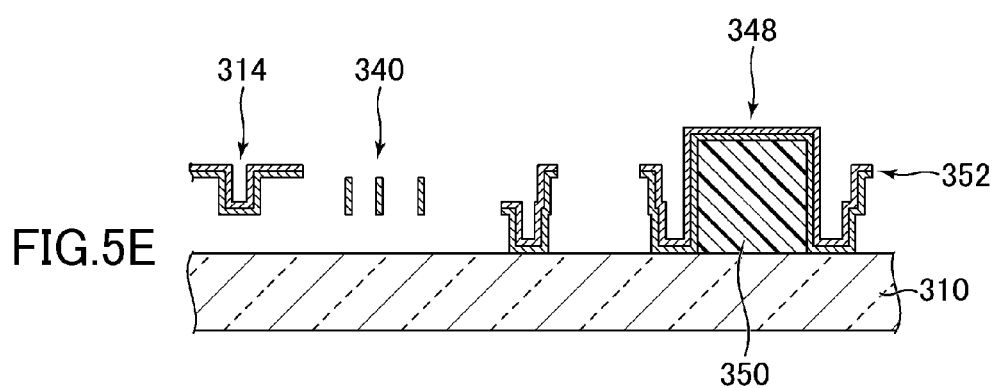
FIG. 5E is a view for explaining the method for manufacturing a display device according to the third embodiment of the present invention.

As shown in FIG. 5D, the second photoresist layer 360 is patterned by photolithography such that the second photoresist layer 360 has the second upper surface 362. Due to the above-mentioned process, a resin layer 350 having the first upper surface 356, the second upper surface 362 and the third upper surface 368 is formed. Then, a film 352 is formed on the resin layer 350, and the film 352 is patterned thus, as shown in FIG. 5E, forming a structure which includes a bump 348, a shutter 314 and a drive part 340 which mechanically drives the shutter 314 on the first substrate 310.

With respect to the detail of other parts of this embodiment, the contents explained in conjunction with the first and second embodiments are applicable to these other parts.

Fourth Embodiment

FIG. 6A to FIG. 6E are views for explaining a method for manufacturing a display device according to the fourth embodiment of the present invention.

Figure 6A:
FIG. 6A is a view for explaining a method for manufacturing a display device according to a fourth embodiment of the present invention.

As shown in FIG. 6A, on a first substrate 410, a first photoresist layer 454 having at least a thickness which allows an upper surface of the first photoresist layer 454 to reach a height position of a first upper surface 456 described later is formed.

Figure 6B:
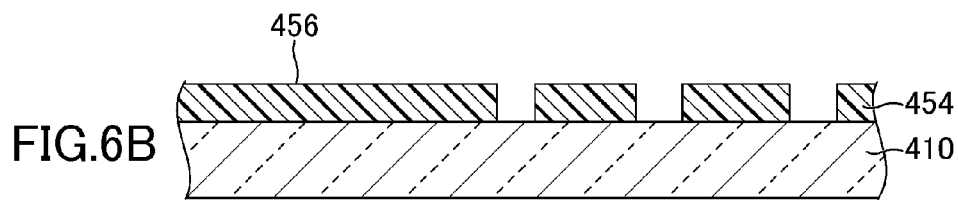
FIG. 6B is a view for explaining the method for manufacturing a display device according to the fourth embodiment of the present invention.

As shown in FIG. 6B, the first photoresist layer 454 is patterned by photolithography such that the first photoresist layer 454 has the first upper surface 456.

Figure 6C:
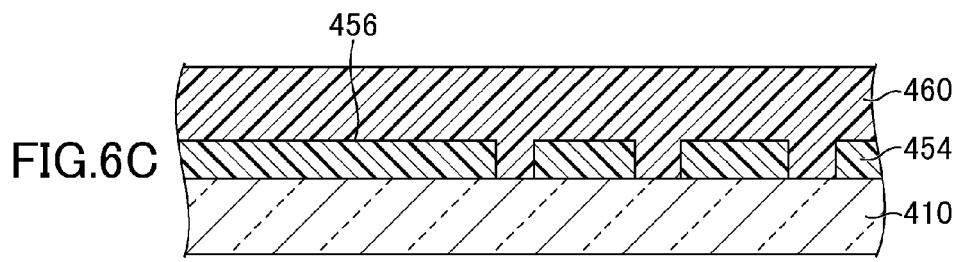
FIG. 6C is a view for explaining the method for manufacturing a display device according to the fourth embodiment of the present invention.

As shown in FIG. 6C, on the patterned first photoresist layer 454, a second photoresist layer 460 having at least a thickness which allows an upper surface of the second photoresist layer 460 to reach a height position of a third upper surface 468 described later is formed.

Figure 6D:
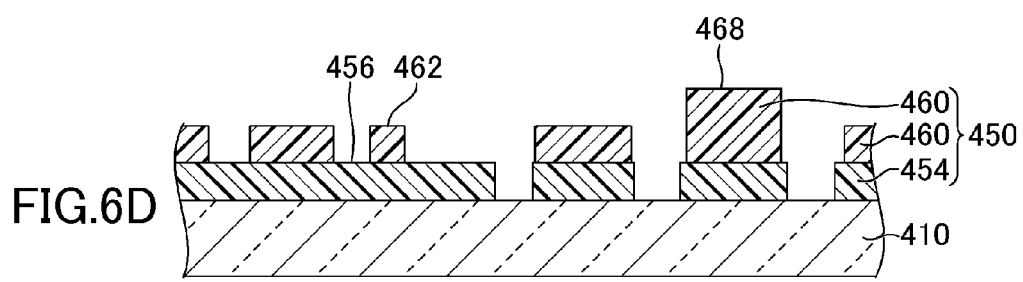
FIG. 6D is a view for explaining the method for manufacturing a display device according to the fourth embodiment of the present invention.
Figure 6E:
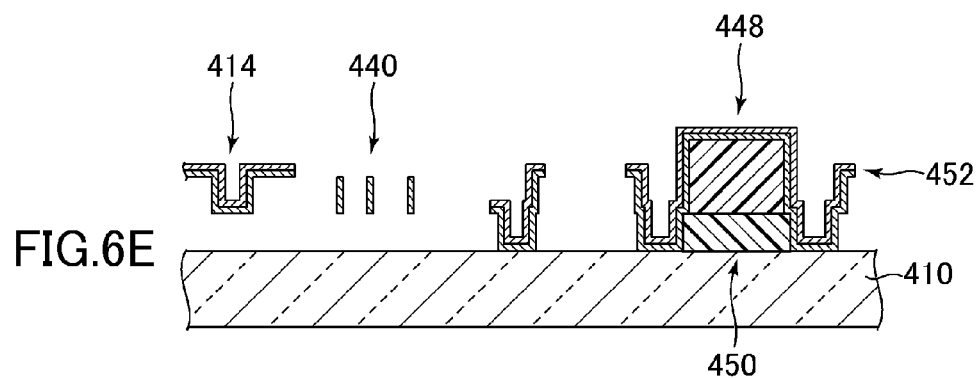
FIG. 6E is a view for explaining the method for manufacturing a display device according to the fourth embodiment of the present invention.

As shown in FIG. 6D, the second photoresist layer 460 is patterned by photolithography which includes the multi-tone exposure such that the second photoresist layer 460 has a second upper surface 462 and the third upper surface 468. The detail of this process is exactly the same as the corresponding process explained in conjunction with the second embodiment. Due to the above-mentioned process, a resin layer 450 having the first upper surface 456, the second upper surface 462 and the third upper surface 468 is formed. Then, a film 452 is formed on the resin layer 450 and the film 452 is patterned thus, as shown in FIG. 6E, forming a structure which includes a bump 488, a shutter 414 and a drive part 440 for mechanically driving the shutter 414 on the first substrate 410.

With respect to the detail of other parts of this embodiment, the contents explained in conjunction with the first and second embodiments are applicable to these other parts.

Fifth Embodiment

FIG. 7A to FIG. 7E are views for explaining a method for manufacturing a display device according to the fifth embodiment of the present invention.

Figure 7A:
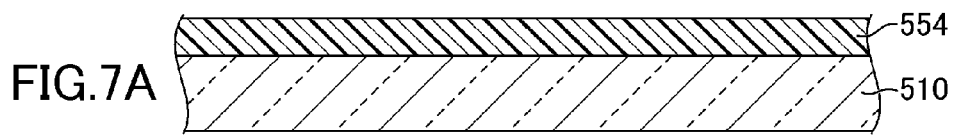
FIG. 7A is a view for explaining a method for manufacturing a display device according to a fifth embodiment of the present invention.

As shown in FIG. 7A, on a first substrate 510, a first photoresist layer 554 having at least a thickness which allows an upper surface of the first photoresist layer 554 to reach a height position of a first upper surface 556 described later is formed.

Figure 7B:
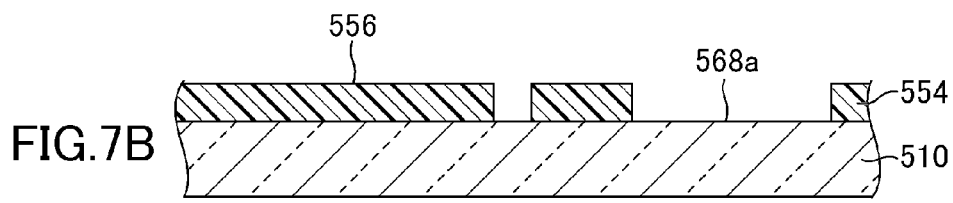
FIG. 7B is a view for explaining the method for manufacturing a display device according to the fifth embodiment of the present invention.

As shown in FIG. 7B, the first photoresist layer 554 is patterned by photolithography. By such patterning, the first photoresist layer 554 is removed from a region 568a where a third upper surface 568 is formed. Further, the first photoresist layer 554 is patterned such that the first photoresist layer 554 has the first upper surface 556.

Figure 7C:
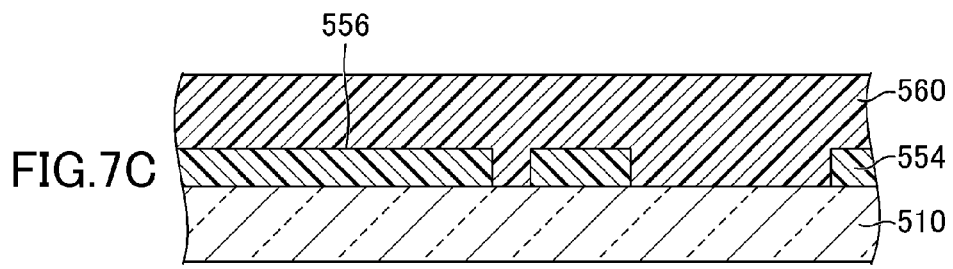
FIG. 7C is a view for explaining the method for manufacturing a display device according to the fifth embodiment of the present invention.

As shown in FIG. 7C, on the first substrate 510 and on the patterned first photoresist layer 554, a second photoresist layer 560 having at least a thickness which allows an upper surface of the second photoresist layer 560 to reach a height position of the third upper surface 568 described later is formed.

Figure 7D:
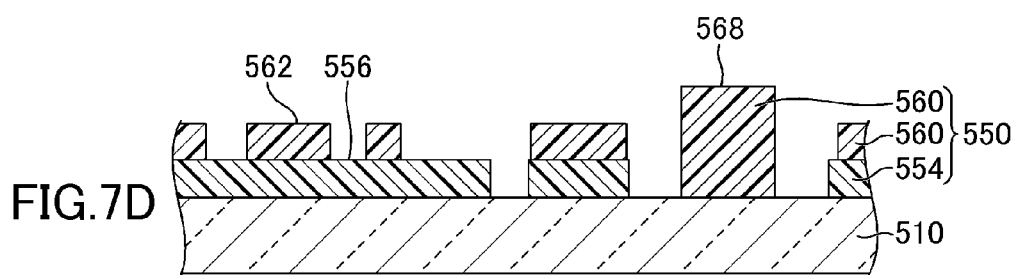
FIG. 7D is a view for explaining the method for manufacturing a display device according to the fifth embodiment of the present invention.
Figure 7E:
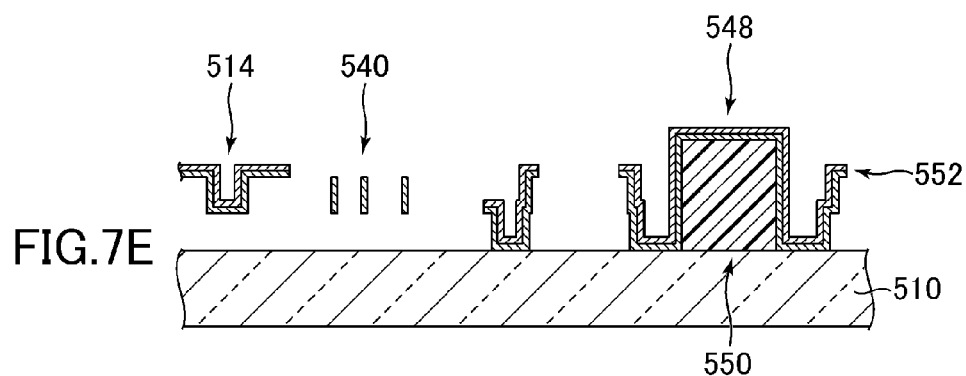
FIG. 7E is a view for explaining the method for manufacturing a display device according to the fifth embodiment of the present invention.

As shown in FIG. 7D, the second photoresist layer 560 is patterned by photolithography which includes the multi-tone exposure such that the second photoresist layer 560 has a second upper surface 562 and the third upper surface 568. The detail of this process is exactly the same as the corresponding process explained in conjunction with the second embodiment. Due to the above-mentioned process, a resin layer 550 having the first upper surface 556, the second upper surface 562 and the third upper surface 568 is formed. Then, a film 552 is formed on the resin layer 550 and the film 552 is patterned thus, as shown in FIG. 7E, forming a structure which includes a bump 548, a shutter 514 and a drive part 540 for mechanically driving the shutter 514 on the first substrate 510.

With respect to the detail of other parts of this embodiment, the contents explained in conjunction with the first and second embodiments are applicable to these other parts.

Application Example

Figure 8A:
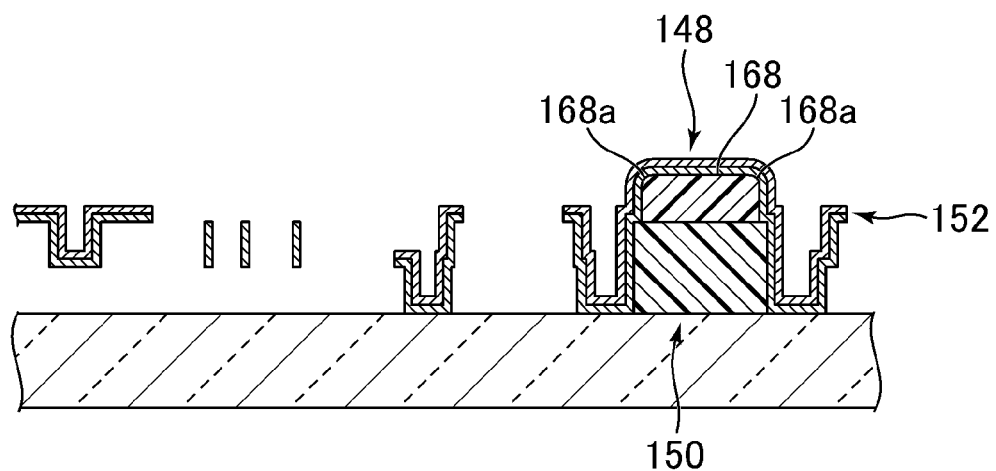
FIG. 8A is a view for explaining a display device and a method for manufacturing the display device according to an application example of the embodiment of the present invention.
Figure 8B:
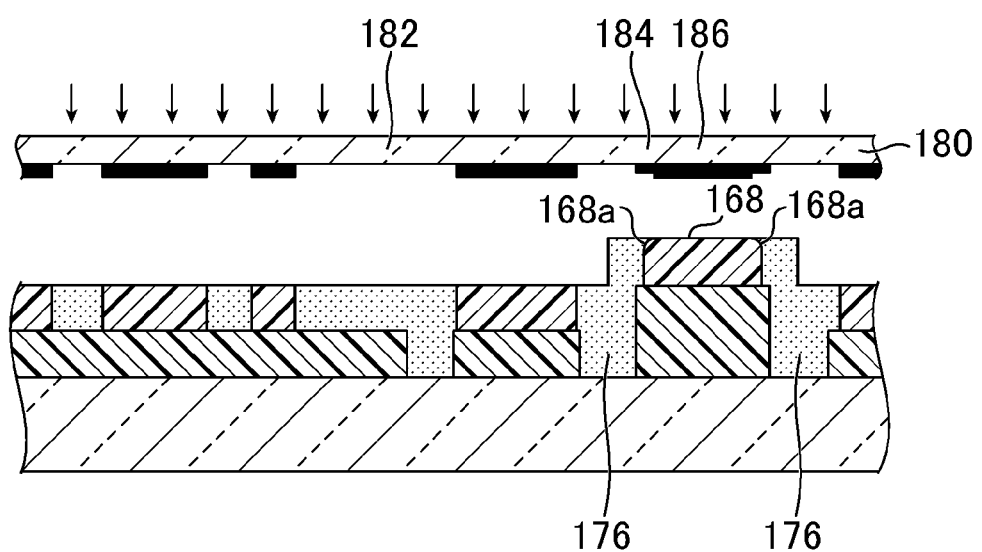
FIG. 8B is a view for explaining the display device and the method for manufacturing the display device according to the application example of the embodiment of the present invention.

FIG. 8A to FIG. 8B are views for explaining a display device and a method for manufacturing the display device according to an application example of the embodiment of the present invention.

In the above-mentioned embodiments, the photoresist layer is patterned by photolithography and hence, for example, as shown in FIG. 4E, a corner is formed on a peripheral portion of the third upper surface 268. When the second photoresist layer 260 is shrunken by post-baking, a center portion of the third upper surface 268 is indented so that the corner of the peripheral portion is formed into a raised shape. The bump which is obtained by forming the film on the third upper surface having such a shape gives rise to a drawback that only the peripheral portion performs a supporting function so that a stress is concentrated on the peripheral portion.

In view of the above, according to this application example, as shown in FIG. 8A, a peripheral portion 168a of a third upper surface 168 of a resin layer 150 which constitutes the inside of a bump 148 is rounded, and a film 152 is formed on the third upper surface 168. Due to such a constitution, the concentration of a stress on the peripheral portion 168a can be avoided and hence, the strength of the bump 148 can be enhanced.

FIG. 8B is a view for explaining a method for forming the third upper surface having the shape where the peripheral portion is rounded. In this application example, the multi-tone exposure is performed in photolithography for forming the third upper surface 168. A multi-tone mask 180 used in the multi-tone exposure has a light transmitting region 182, a light semi-transmitting region 184 and a light blocking region 186. It is sufficient that the light semi-transmitting region 184 is a region where optical transmissivity is lower than optical transmissivity of the light transmitting region 182 so that the optical transmissivity of the light semi-transmitting region 184 is not limited to 50%.

When the photoresist layer is formed using a positive photoresist, the light transmitting region 182 of the multi-tone mask 180 is arranged above a region where the whole photoresist layer in the thickness direction is removed, and the light blocking region 186 is arranged above a region where the photoresist layer is not removed. Then, the light semi-transmitting region 184 is arranged above the peripheral portion 168a of the third upper surface 168.

In a region where the peripheral portion 168a of the third upper surface 168 is formed, solubility in a developer is higher than solubility in the developer in a region where the center portion of the third upper surface 168 is formed and is lower than solubility in the developer in a region where a cut 176 is formed. By setting the solubility in this manner, the peripheral portion 168a of the third upper surface 168 can be formed such that the peripheral portion 168a extends obliquely downwardly (for example, in a rounded shape). The contents of this application example are applicable to all of the above-mentioned embodiments.

Figure 9:
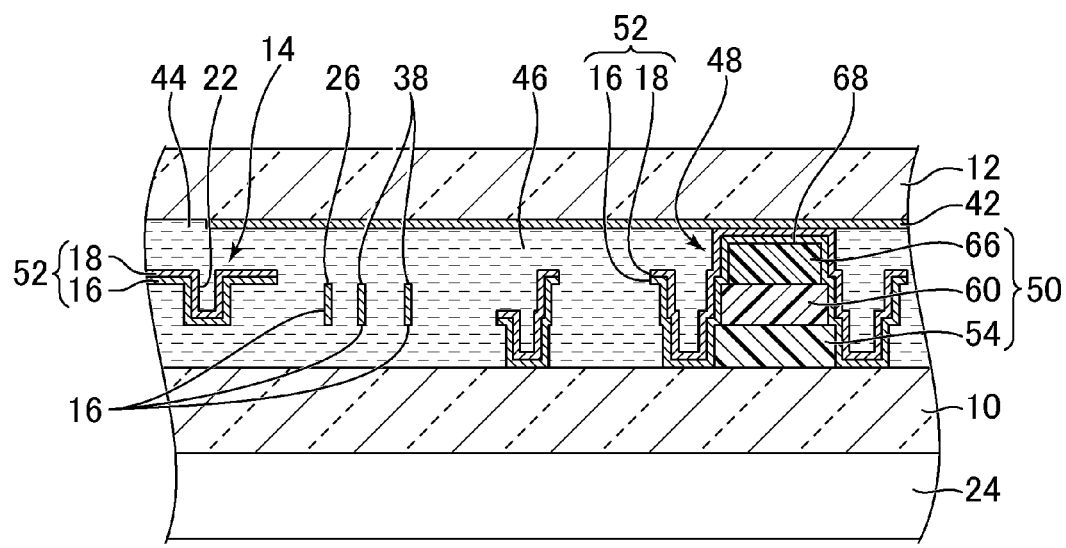
FIG. 9 is a view for explaining a display device according to a modification of the embodiment of the present invention.
Figure 10:
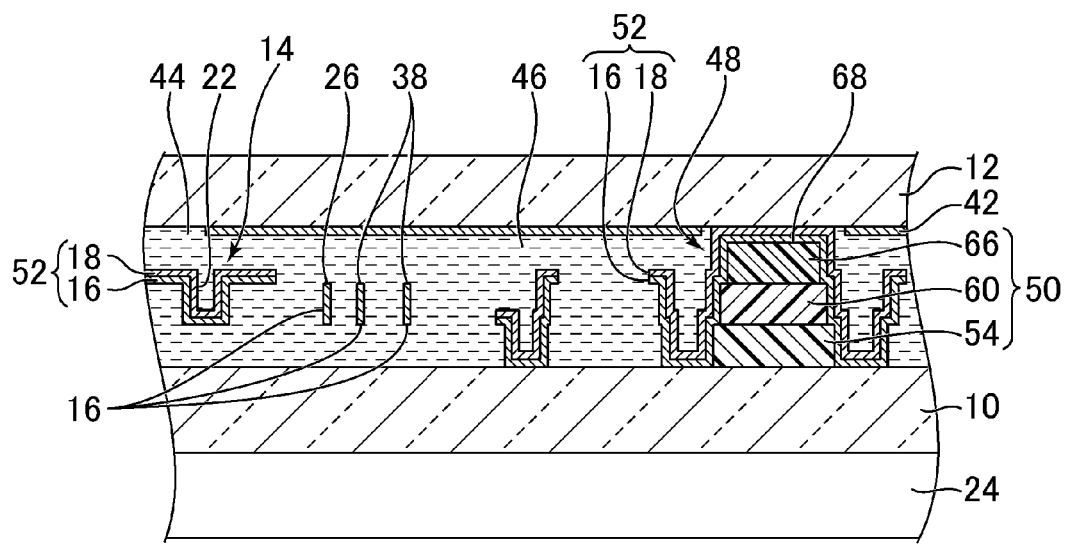
FIG. 10 is a view for explaining a display device according to another modification of the embodiment of the present invention.

The present invention is not limited to the above-mentioned embodiments, and various modifications are conceivable. For example, in FIG. 1 to FIG. 8B, adopted is a constitution where the gap is formed between the bump 48 and the second substrate 12. However, the bump 48 may be formed such that the upper surface of the bump 48 is brought into contact with the light blocking film 42 formed on the second substrate 12 as shown in FIG. 9 or the upper surface of the bump 48 may be brought into contact with the second substrate 12 as shown in FIG. 10. Further, the constitution explained in conjunction with the above-mentioned embodiments is exchangeable with the constitution which is substantially equal to the constitution described in the embodiments, the constitution which acquires the substantially equal manner of operation and advantageous effects as the embodiments, or the constitution which achieves the same object as the embodiments.

What is claimed is:

1. A display device comprising:
a first substrate;
a shutter which is formed on the first substrate and a drive part which is connected to the shutter;
a second substrate which is arranged such that the second substrate faces the first substrate in an opposed manner with a distance therebetween;
a bump which is arranged between the first substrate and the second substrate and which holds the distance between the first and second substrates; and
oil which is filled into a space defined between the first substrate and the second substrate, wherein
the bump includes a resin layer which is formed on the first substrate and a film which covers the whole resin layer except for a bottom surface of the resin layer, the shutter and the drive part are made of the same material as the film, and an uppermost surface of the bump is at a greater height above the first substrate than an uppermost surface of the shutter.

2. The display device according to claim 1, wherein the film exhibits higher dissolution resistance to the oil than the resin layer does.

3. The display device according to claim 1, wherein the film includes a semiconductor film and a metal film.

4. The display device according to claim 3, wherein the semiconductor film is made of amorphous silicon.

5. The display device according to claim 3, wherein the metal film is made of aluminum.

6. The display device according to claim 1, wherein the bump faces the second substrate with a predetermined gap therebetween.

7. The display device according to claim 1, wherein the bump is formed in contact with the second substrate.

8. The display device according to claim 7, wherein the second substrate includes a light blocking film in which an opening is formed, and
the bump is formed in contact with the light blocking film.

* * * * *